United States Patent
Hung et al.

(10) Patent No.: US 8,230,302 B2
(45) Date of Patent: Jul. 24, 2012

(54) DATA PROTECTION METHOD FOR MEMORY

(75) Inventors: Wei-Tsz Hung, Taipei (TW); Yen-Lung Chiu, Taipei (TW); Yu-Hsiang Chiu, Taipei (TW)

(73) Assignee: ALi Corporation, Taipei (TW)

( * ) Notice: Subject to any disclaimer, the term of this patent is extended or adjusted under 35 U.S.C. 154(b) by 830 days.

(21) Appl. No.: 12/366,099

(22) Filed: Feb. 5, 2009

(65) Prior Publication Data

US 2010/0122114 A1    May 13, 2010

(30) Foreign Application Priority Data

Nov. 10, 2008   (CN) .......................... 2008 1 0174866

(51) Int. Cl.
   *G11C 29/00* (2006.01)
(52) U.S. Cl. ..................... 714/764; 365/185.2
(58) Field of Classification Search .............. 714/764; 365/185.2
   See application file for complete search history.

(56) References Cited

U.S. PATENT DOCUMENTS

| | | | |
|---|---|---|---|
| 5,963,970 A * | 10/1999 | Davis ........................... | 711/103 |
| 7,032,087 B1 | 4/2006 | Chang et al. | |
| 7,173,852 B2 | 2/2007 | Gorobets et al. | |
| 7,224,607 B2 | 5/2007 | Gonzalez et al. | |
| 7,315,916 B2 | 1/2008 | Bennett et al. | |
| 2005/0204212 A1* | 9/2005 | Noguchi et al. .............. | 714/710 |
| 2007/0091677 A1 | 4/2007 | Lasser et al. | |
| 2008/0294813 A1* | 11/2008 | Gorobets ........................ | 710/62 |

* cited by examiner

*Primary Examiner* — Sam Rizk
(74) *Attorney, Agent, or Firm* — J.C. Patents

(57) ABSTRACT

A data protection method is provided. The data protection method is adapted for a plurality of pages of a plurality of blocks in a memory. The data protection method records bit error weight values and erasing times of the blocks during routine operations of the memory. Therefore, when the system is in an idle status, the data of those blocks having higher bit error weight values can be recovered. Further, the data protection method moves data of those blocks having less erasing times to other blocks, so as to release the blocks having less erasing times from the data area for use. Then, the data protection method utilizes all blocks of the non-volatile memory in an average manner, so as to effectively protect the data saved in the memory and average the erasing operations.

18 Claims, 7 Drawing Sheets

DATA PROTECTION METHOD FOR MEMORY

CROSS-REFERENCE TO RELATED APPLICATION

This application claims the priority benefit of Chinese application serial no. 200810174866.9, filed on Nov. 10, 2008. The entirety of the above-mentioned patent application is hereby incorporated by reference herein and made a part of this specification.

BACKGROUND OF THE INVENTION

1. Field of the Invention

The present invention generally relates to a data protection method, and more particularly, to a data protection method for a memory.

2. Description of Related Art

Flash memories, having the advantages including non-volatility, high density, and fast response, have become an outstanding one of the many kinds of commercialized memories. However, with respect to a conventional flash memory, even only repetitive reading operations may cause variations of the data saved in the flash memory, which may further lead to an unpredictable error that the read data is inconsistent with the original data.

In order to avoid the occurrence of such an unpredictable error, error correction codes are often utilized in data protection technologies for protecting data saved in flash memories. For example, when the data saved in a flash memory is being read, the system can execute a limited error recovery to the flash memory by conducting a calculation of error correction codes at a controller end. The error recovery depends on the capability of a controller to generate error correction codes to protect data. For example, one controller may be capable of detecting and recovering 1 bit from 256 bytes, while another controller may be capable of detecting and recovering 4 bits or even 8 bits from 512 bytes.

However, even though facilitated with such error correction codes, when a flash memory has been read for a long time, it may also have the problem that the error exceeds the calculation capability of the controller. Correspondingly, a conventional technology proposes to read out the data saved in the flash memory and correct the error thereof and then rewrite the data back to the flash memory before the saved data exceeding the recovery capability of the error correction codes, so as to assure the correctness of the data saved in the flash memory. However, instant operations of data reading out, data correction, and data rewriting back to the flash memory drastically affect the speed of the system reading data from the flash memory.

Alternatively, in accordance with another conventional technology, when the system is in an idle status, the data saved in the flash memory is sequentially read out, and if there is an erroneous data detected during the reading process, the erroneous data would be corrected and thus rewritten back to the flash memory. Unfortunately, when the flash memory has a larger capacity, the time spent on scanning all data saved in the flash memory is also longer. Therefore, some erroneous data may be detected relatively late, so that the error bit number of the data exceeds the correcting capability of the error correction codes. Further, the recovery and moving operations add additional erase times of the blocks of the flash memory, thus consuming the lifetime of the blocks.

In other words, it has become a major concern of using flash memories to effectively protect the data of the flash memories, and simultaneously consider the reading speed and lifetime of the flash memories.

SUMMARY OF THE INVENTION

Accordingly, the present invention is directed to provide a data protection method, for protecting a data saved in a non-volatile memory, while simultaneously considering the reading speed and lifetime of the non-volatile memory.

The present invention provides a data protection method, adapted for a non-volatile memory. The non-volatile memory includes a plurality of blocks, each of the blocks includes a plurality of pages. The blocks of the non-volatile memory are partitioned into a data area and a spare area. The data protection method includes the following steps. First, calculation results of error correction codes of the pages of the non-volatile memory are used for updating bit error weight values of the blocks recorded in a first form, so as to determine whether to backup at least one recovery data to a volatile memory. Then, erasing times of the blocks are recorded in a second form, and meanwhile the first form is updated.

Then, a block having a minimum erasing time is selected out from the spare area according to the second form as a replacement block. It is then determined whether to execute a block exchange of a specific block with the replacement block in accordance with whether there is a recovery data saved in the volatile memory.

According to an embodiment of the present invention, the data protection method further includes a step of determining whether to execute the block exchange of the specific block with the replacement block according to the efficiency value of recovery and substitution of the specific block.

According to an embodiment of the present invention, the data protection method further includes the following steps. It is determined that whether there is any recovery data saved in the volatile memory. When there is a recovery data saved in the volatile memory, a specific block, to which the recovery data belongs, is selected from the data area of the non-volatile memory, and a part of data of the specific block and the recovery data are sequentially saved in the replacement block. When there is no recovery data saved in the volatile memory, the efficiency values of recovery and substitution of the blocks of the non-volatile memory are calculated, by which the specific block is selected out, and whether to save data of the specific block into the replacement block is determined according to a first threshold value.

According to an embodiment of the present invention, the data protection method further includes: determining whether a system with the non-volatile memory is in an idle status; when the system with the non-volatile memory is in the idle status, repeating all of the above steps; and when the system with the non-volatile memory is not in the idle status, suspending all steps.

According to an embodiment of the present invention, the step of selecting the specific block to which the recovery data belong from the data area, and sequentially saving the part of data saved into the specific block and the recovery data in the replacement block further includes the following steps. First, a page and a block to which the recovery data belongs are selected from the pages and the blocks and are determined as a specific page and the specific block. Then, data saved in the block other than those saved in the specific page is read out, and are sequentially saved together with the recovery data into the replacement block.

According to an embodiment of the present invention, the step of calculating the efficiency values of recovery and substitution of the blocks to select out the specific block, and determining whether to save data of the specific block into the replacement block according to the first threshold value further includes the following steps. First, the bit error weight values recorded in the first form and the erasing times recorded in the second form are calculated with a predetermined equation, so as to obtain the efficiency values of recovery and substitution of the blocks. Then, a block having a maximum efficiency value of recovery and substitution is selected from the data area, and taken as the specific block.

Further, it is determined that whether the efficiency value of recovery and substitution is greater than the first threshold value. When the efficiency value of recovery and substitution is greater than the first threshold value, the data saved in the specific block is read out and recovered, and the recovered data of the specific block is sequentially saved into the replacement block. Correspondingly, when the efficiency value of recovery and substitution is smaller than the first threshold value, the data saved in the specific block is not required to be substituted.

According to an embodiment of the present invention, the step of substituting between the specific block and the replacement block includes the following steps. First, a logic address linked to the specific block is varied to link to the replacement block. Then, the data saved in the specific block is cleared, and thus the specific block is moved to the spare area.

The present invention records bit error weight values and erasing times of the blocks during routine operations of the non-volatile memory. Therefore, when the system is in an idle status, the data of those blocks having higher bit error weight values can be recovered, so as to maintain the data being recovered before it exceeds the correcting capability of the error correction codes. Further, the present invention moves data of those blocks having less erasing times to other blocks, so as to release the blocks having less erasing times for more effective use. In such a way, comparing with the conventional technologies, the present invention utilizes all blocks of the non-volatile memory in a more average manner, so as to further extend the lifetime of the non-volatile memory. Further, the present invention employs a more effective mechanism to provide an optimal protection to the data saved in the non-volatile memory and averagely execute the erasing operations, thus improving the reading speed of the non-volatile memory.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
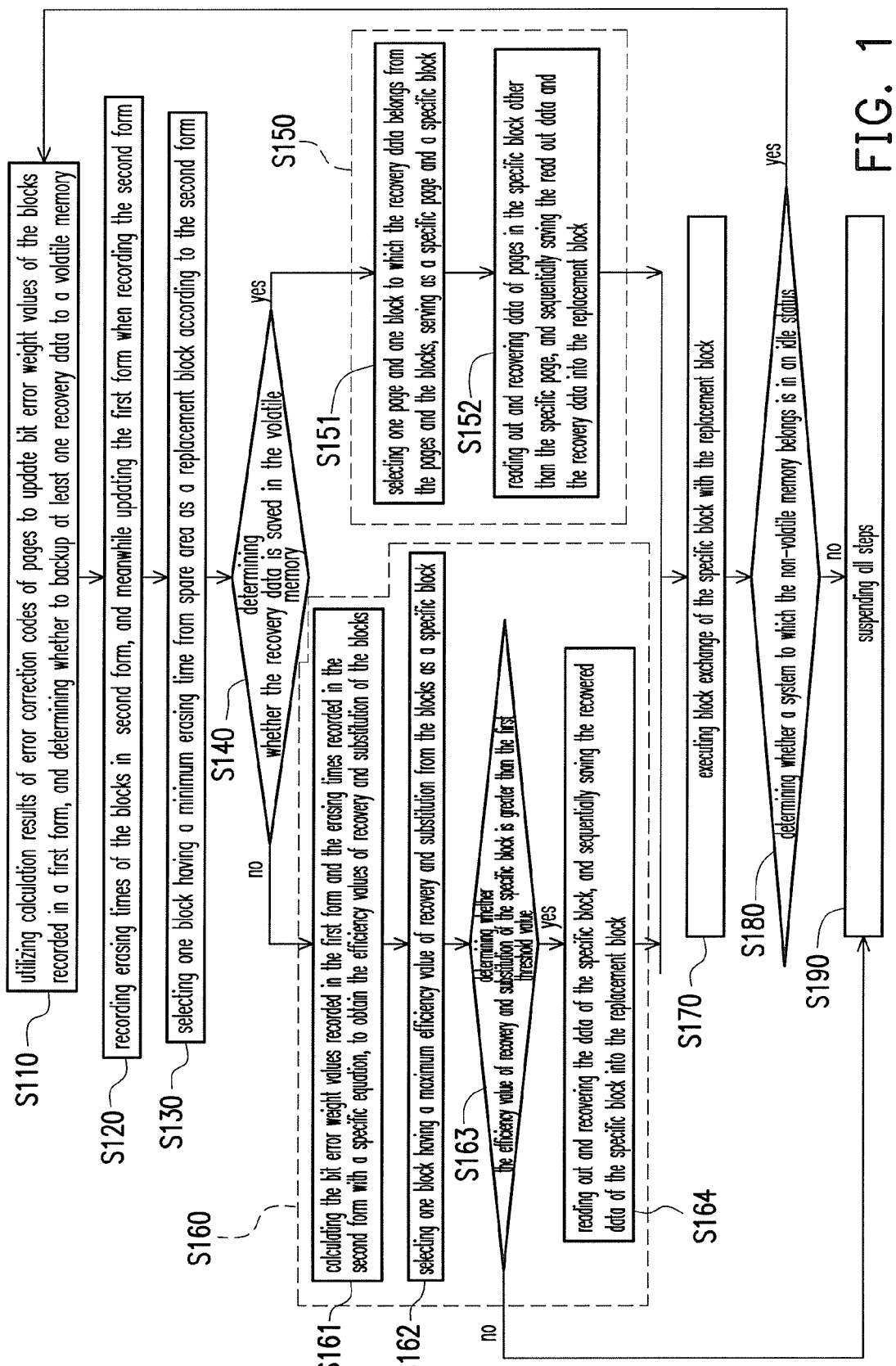
FIG. 1 is a flow chart illustrating a data protection method according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a flow chart illustrating a data protection method according to an embodiment of the present invention. The data protection method is adapted for a memory. In depicting the present invention, the memory is illustrated taking a non-volatile memory as an example. The non-volatile memory for example can be a flash memory.

Figure 2:
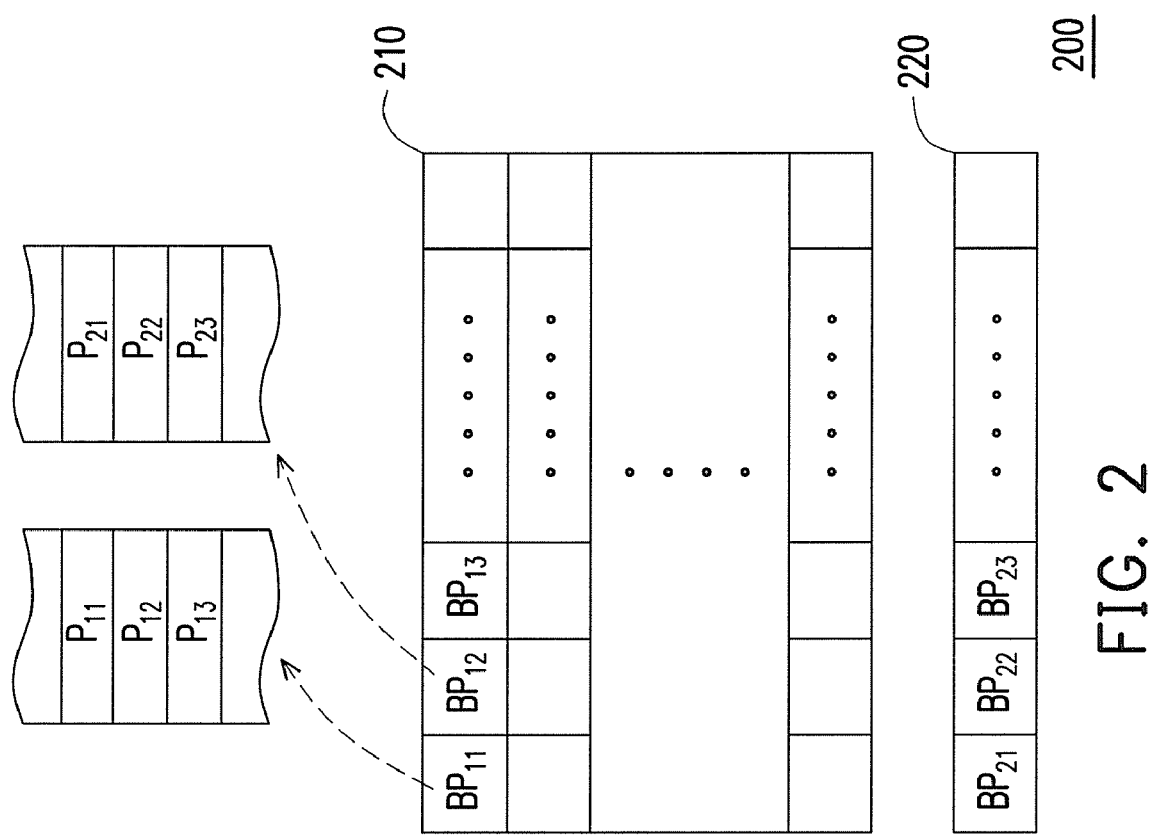
FIG. 2 is a schematic structural diagram illustrating a flash memory according to an embodiment of the present invention.

Prior to illustrating the data protection method of the embodiment in details, the flash memory is to be structurally illustrated hereby. As shown in FIG. 2, there is shown a flash memory 200 partitioned into a plurality of physical blocks. For example, the flash memory 200 includes a plurality of physical blocks, e.g., $BP_{11}$ to $BP_{13}$, and $BP_{21}$ to $BP_{23}$. For convenience of illustration, the physical blocks are briefly described as blocks when mentioned below. Further each of the blocks is divided into a plurality of pages. For example, the block $BP_{11}$ includes pages $P_{11}$ to $P_{13}$, while the block $BP_{12}$ includes pages $P_{21}$ to $P_{23}$.

Generally, a block of the flash memory is a minimum unit for executing an erasing operation, while a page of the block is a minimum unit for executing a programming or reading operation. Further, for simplifying the management complexity of the flash memory, the blocks of the flash memory are divided into several areas. For example, the blocks of the flash memory 200 are divided into a data area 210 and a spare area 220. It should be noted that although the present invention is illustrated in accordance with the embodiment in which the blocks are divided into different areas, the present invention is not exclusive restricted as such. In other words, any flash memory which blocks are not divided into different areas can also be complied with the data protection method according to the present invention to achieve the similar protection effect.

Referring to FIGS. 1 and 2 together, the data protection method of the current embodiment is shown. First, at step S110, calculation results of error correction codes of several pages are used for updating bit error weight values of the blocks recorded in a first form, so as to determine whether to backup at least one recovery data to a volatile memory.

Figure 3:
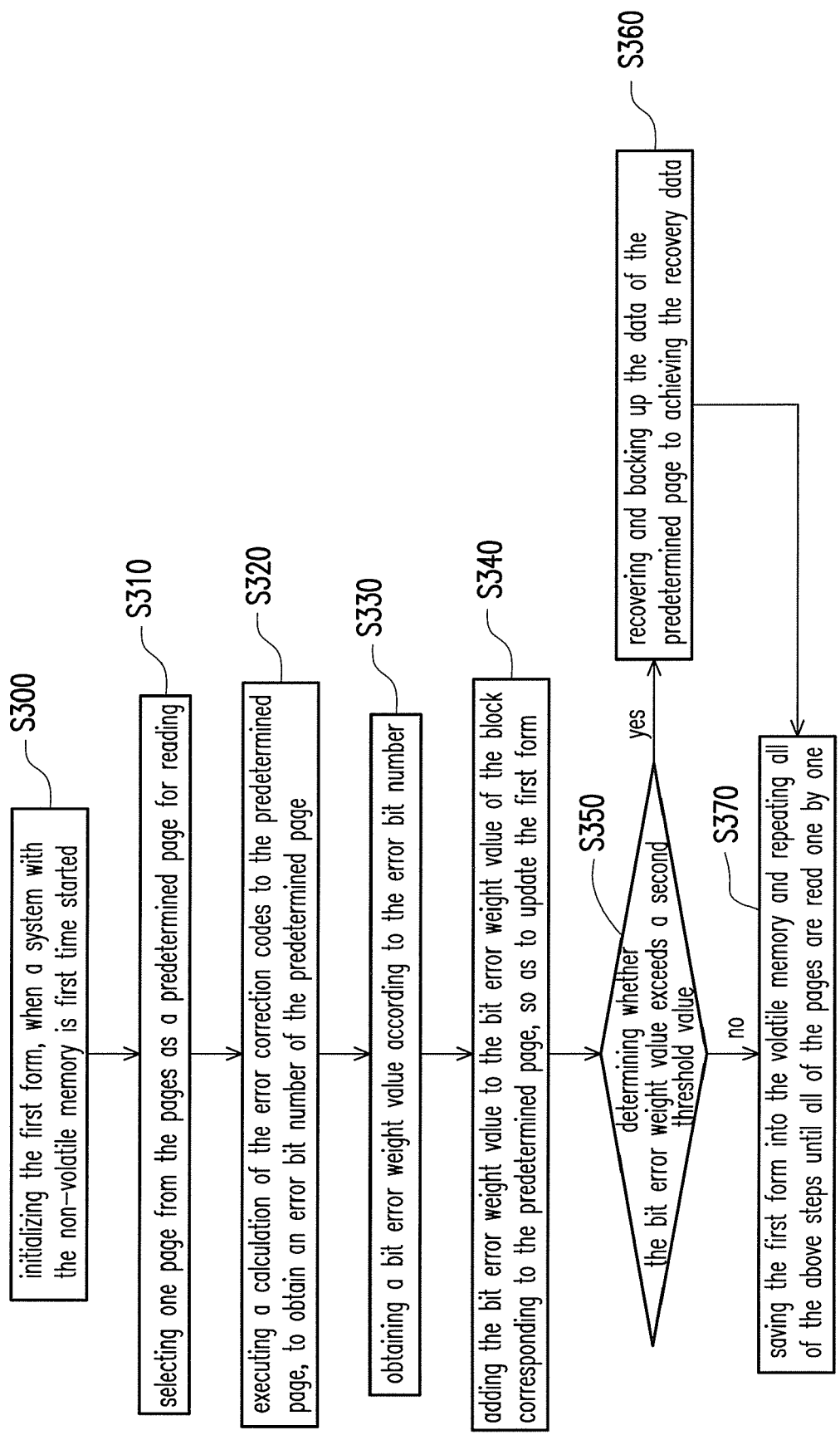
FIG. 3 is a detailed flow chart illustrating the step S110 of FIG. 1 according to an embodiment of the present invention.

FIG. 3 is a detailed flow chart illustrating the step S110 of FIG. 1 according to an embodiment of the present invention. Taking the flash memory 200 shown in FIG. 2 as an example, and further referring to FIGS. 2 and 3 together, there are shown the detailed steps of step S110.

First, at step S300, when the system to which the non-volatile memory (e.g., the flash memory 200) is first time started, the first form is initialized, in which the bit error weight values $ED_b$ of all blocks recorded in the first form are set as 0. Then, at step S310, one page is selected from the pages of the blocks of the flash memory 200 for reading. For example, the flash memory 200 is constituted by blocks $BP_{11}$ and $BP_{12}$ only, and the pages of the blocks $BP_{11}$ and $BP_{12}$ are pages $P_{11}$ to $P_{13}$ and $P_{21}$ to $P_{23}$ respectively. When the page selected for reading is $P_{11}$, the page $P_{11}$ is considered as a predetermined page. Then, at step S320, the predetermined page $P_{11}$ is executed with a calculation of the error correction codes, so as to obtain the error bit number of the predetermined page $P_{11}$.

Then, at step S330, a bit error weight value $ED_{bp}$ is obtained according to the error bit number. For example, as shown in equation (1), when the error bit number of the predetermined page $P_{11}$ is detected to be 1 (e.g., there is 1 erroneous bit in the predetermined page $P_{11}$), the bit error weight value $ED_{bp}$ is equal to $a_1$. Correspondingly, when the error bit number of the predetermined page $P_{11}$ is detected to be 2 (e.g., there are 2 erroneous bits in the predetermined page $P_{11}$), the bit error weight value $ED_{bp}$ is equal to $a_2$.

$$ED_{bp} = \begin{cases} a_1, & 1 \text{ bit error} \\ a_2, & 2 \text{ bits error} \\ \vdots \\ a_n, & n \text{ bits error} \end{cases} \quad \text{equation (1)}$$

Then, at step S340, the bit error weight value $ED_{bp}$ is accumulately added to the bit error weight value $ED_b$ of the block $BP_{11}$ corresponding to the predetermined page $P_{11}$. For example, referring to equation (2), at step S340, the error weight value $ED_{bp}$ is added to the bit error weight value $ED_b$, thus obtain an accumulated bit error weight value $ED_b'$. As set forth above, the bit error weight values $ED_b$ are recorded in the first form, and therefore at step S340, the bit error weight value $ED_b$ of the block $BP_{11}$ originally recorded in the first form is updated to the accumulated bit error weight value $ED_b'$.

$$ED_b' = ED_b + ED_{bp} \quad \text{equation (2)}$$

Further, at step S350, it is determined whether the bit error weight value $ED_{bp}$ exceeds a second threshold value. If the maximum error bit number which can be corrected by the error correction codes is 8, the second threshold value can be set as a bit error weight value $\{a_6\}$ corresponding to an error bit number 6. In such a way, the system can determine a recoverable rate of the data of the predetermined page $P_{11}$ by comparing the bit error weight value $ED_{bp}$ with the second threshold value, thus determining whether to backup the data of the predetermined page $P_{11}$. It should be noted that those skilled in the art could vary the second threshold value in accordance with the practical design as desired.

When the bit error weight value $ED_{bp}$ exceeds a second threshold value, that indicates the data of the predetermined page $P_{11}$ is going to exceed the correcting capability of the error correction codes. Thus, at step S360, the data of the predetermined page $P_{11}$ is recovered and backed up, and is saved as a recovery data in a volatile memory, e.g., dynamic random access memory (DRAM) of the system.

On the contrary, when the bit error weight value $ED_{bp}$ does not exceed the second threshold value yet, that indicates the data of the predetermined page $P_{11}$ is within the correcting capability of the error correction codes and can be recovered by the error correction codes. In this case, the flow executes step S370. At step S370, the first form is saved in the flash memory 200, and the foregoing steps S310 through S360 are repeated, until all pages of the flash memory 200 have been read one by one.

According to the previously mentioned steps of the present invention, the system reads the page $P_n$ during routine reading operation, so as to timely update the first form and the second form, without specifically reading each of the pages one by one. Further, when the system is idled for a long time, the system can also arrange to execute an overall updating protection by sequentially reading all of the pages. In other words, the pages $P_{11}$ to $P_{13}$, and $P_{21}$ to $P_{23}$ can be sequentially taken as the predetermined page. In such a way, the bit error weight value $ED_{bp}$ of the pages $P_{11}$ to $P_{13}$ obtained according to the error correction codes are used for updating the bit error weight value $ED_b$ of the block $BP_{11}$ in the first form, and determining whether to backup the pages $P_{11}$ to $P_{13}$ according to a comparison with the second threshold value. Correspondingly, the bit error weight value $ED_{bp}$ of the pages $P_{21}$ to $P_{23}$ obtained according to the error correction codes are used for updating the bit error weight value $ED_b$ of the block $BP_{12}$ in the first form, and determining whether to backup the pages $P_{21}$ to $P_{23}$ according to a comparison with the second threshold value.

In such a way, the system is allowed to record the bit error weight value of each block by executing step S110 and timely backup the data that is going to exceed the correcting capability of the error correction codes, during the routine operation of reading the non-volatile memory. Then, at step S120, the system records the erasing times of the blocks in the second form, and updates the first form at the same time of recording the second form.

Figure 4:
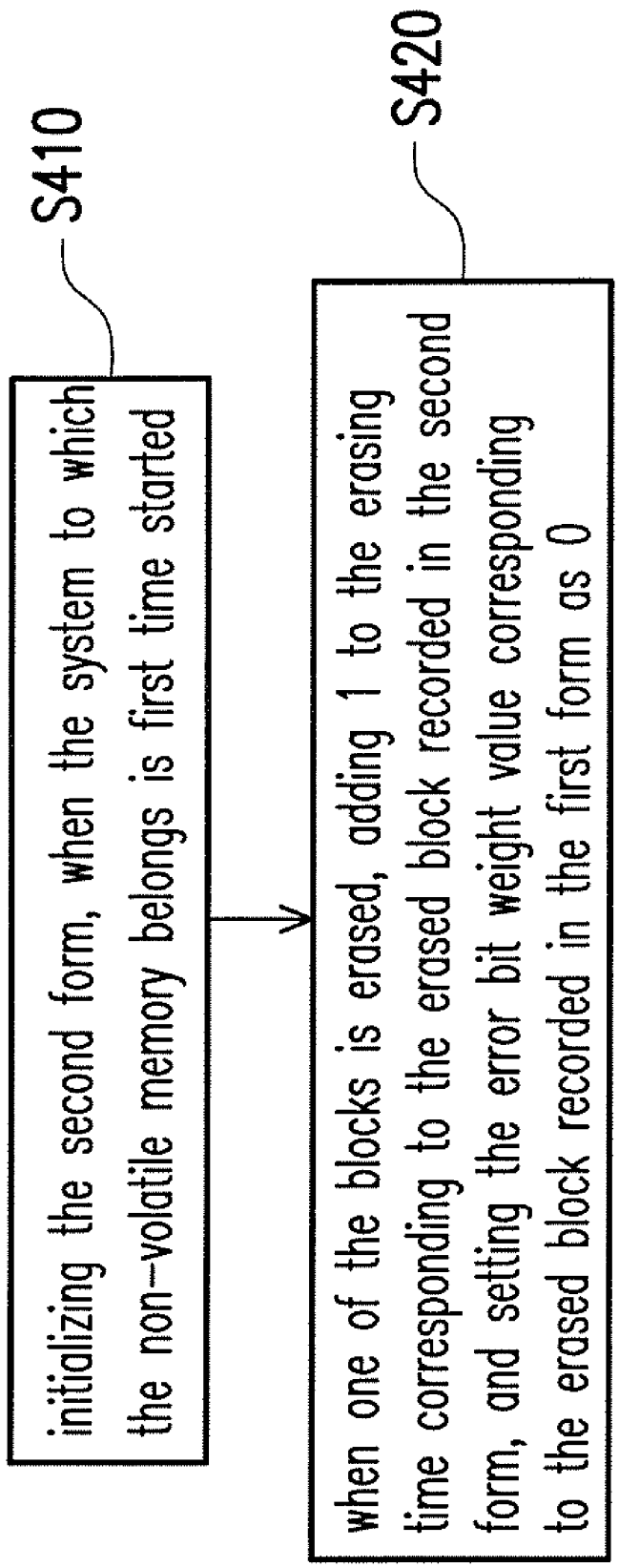
FIG. 4 is a detailed flow chart illustrating the step S120 according to an embodiment of the present invention.

For example, FIG. 4 is a detailed flow chart illustrating the step S120 according to an embodiment of the present invention. Taking the flash memory 200 shown in FIG. 2 as an example, and further referring to FIGS. 2 and 4 together, there are shown the detailed steps of step S120.

First, at step S410, when the system to which the non-volatile memory belongs is first time started, the second form is initialized, in which the erasing times $EC_b$ of all blocks recorded in the second form are set as 0. Then, at step S420, when one of the blocks, e.g., $BP_{11}$, is erased, the erasing time $EC_b$ in the second form corresponding to the erased block $BP_{11}$ is added with 1, and the bit error weight value $ED_b$ in the first form corresponding to the cleared block $BP_{11}$ is set to be 0.

In such a way, the system records the erasing times of each of the blocks by executing step S120, during the routine operation of erasing the non-volatile memory. Then, at step S130, a block with a minimum erasing time is selected from the spare area according to the second form, and is taken as a replacement block. It should be noted that in case the memory is not divided into a data area and a spare area, then a block having a minimum/least erasing time is selected from all of the blocks according to the second form, and is taken as a replacement block. For example, as shown in FIG. 2, if the block $BP_{21}$ of the spare area 220 has the minimum erasing time, then the block $BP_{21}$ is taken as the replacement block.

Then, step S140 is executed to determine whether there is any recovery data saved in the volatile memory. If the volatile memory contains some data saved therein, then the flow executes step S150. In this case, a specific block to which the recovery data is belonged is selected from the data area, and a part of data of the specific block and the recovery data are sequentially saved into the replacement block.

For example, supposing that the block $BP_{21}$ of the spare area 200 is a replacement block, and the volatile memory contains the recovery data of the page $P_{11}$, therefore, at step S150, the block $BP_{11}$ and the page $P_{11}$ to which the recovery data is belonged are respectively selected from all of the blocks and all of the pages, and are taken as a specific block and a specific page (step S151). Then, at step S152, data of pages in the specific block other than the specific pages $P_{11}$ are read out and recovered. For example, data of pages $P_{12}$ and $P_{13}$ are read out and recovered. Then, the data of the pages in the specific block other than the specific pages $P_{11}$ and the recovery data are sequentially saved into the replacement block $BP_{21}$.

Further, if there is no recovery data saved in the volatile memory, then at step S160, efficiency values $BE_b$ of recovery and substitution of the blocks are calculated for selecting the specific block from the data area, and it is determined whether to save the data of the specific block into the replacement block according to the first threshold value.

Specifically, the detailed flow of the step S160 is depicted as following. First, at step S161, the bit error weight values $ED_b$ recorded in the first form and the erasing times $EC_b$ recorded in the second form are calculated with a specific equation so as to obtain the efficiency values $BE_b$ of recovery and substitution. For example, when the efficiency value of recovery and substitution of the $i^{th}$ block is represented as $BE_{bi}$, and the bit error weight value thereof is represented as $ED_{bi}$, and the erasing times thereof is represented as $EC_{bi}$, while the minimum erasing time of the spare area 220 recorded in the second form is represented as MinEC (in case the memory is not divided into a data area and a spare area, then a block having a minimum erasing times is selected from all of the blocks according to the second form, and represented as MinEC), then the specific equation is defined as:

$$BE_{bi}=\alpha ED_{bi}+\beta(MinEC-EC_{bi})$$

when $(MinEC-EC_{bi})<0$ '$\beta=0$ equation (3)

in which i is a positive integer, $\alpha$ and $\beta$ are factors.

Then, at step S162, a block having a maximum efficiency value of recovery and substitution is selected from the data area, and taken as a specific block. It should be noted that in case the memory is not divided into a data area and a spare area, then a block having a maximum efficiency value of recovery and substitution is selected from all of the blocks according to the second form, and taken as a specific block. In other words, blocks in the data area having greater bit error weight values $ED_b$ have high priority to be selected as the specific block. Further, when an erasing time of a certain block is much smaller than the maximum erasing time of all blocks in the spare area, the certain block also has high priority to be selected as the specific block. Weights of the two priorities discussed above are normalized by the setting of the two factors $\alpha$ and $\beta$.

Then, at step S163, it is determined whether the efficiency value of recovery and substitution of the specific block is greater than the first threshold value. When the efficiency value of recovery and substitution is smaller than the first threshold value, which indicates none of the blocks is required to be executed with a data recovery or data moving operation. In this case, step S190 is executed to stop all steps. In such a way, unnecessary writing operations executed to the blocks can be reduced, thus the lifetime of the memory can be improved. Correspondingly, when the efficiency value of recovery and substitution is greater than the first threshold value, then at step S164, the data of the specific block is read out and recovered, and the recovered data of the specific block is sequentially saved into the replacement block.

Then, at step S170, a block exchange is executed between the specific block and the replacement block. For example, assuming that the block $BP_{11}$ of the data area 210 is the specific block, and the block $BP_{21}$ of the spare area 220 is the replacement block, at step S170, a logical block address linked to the specific block $BP_{11}$ is changed to be linked to the replacement block $BP_{21}$. Further, the step S170 further clears the data of the specific block $BP_{11}$, and moves the specific block $BP_{11}$ which originally belongs to the data area 210 to the spare area 220.

After the recovery and moving operations are completed, at step S180, it is determined whether the system to which the non-volatile memory belongs is in an idle status. When the system to which the non-volatile memory belongs is not in an idle status, the step S190 is executed to stop all steps. Correspondingly, when the system to which the non-volatile memory belongs is in the idle status, all steps are repeated until the system feeds back a busy status, or the maximum efficiency value of recovery and substitution of the blocks in the data area is smaller than the first threshold value.

Figure 5:
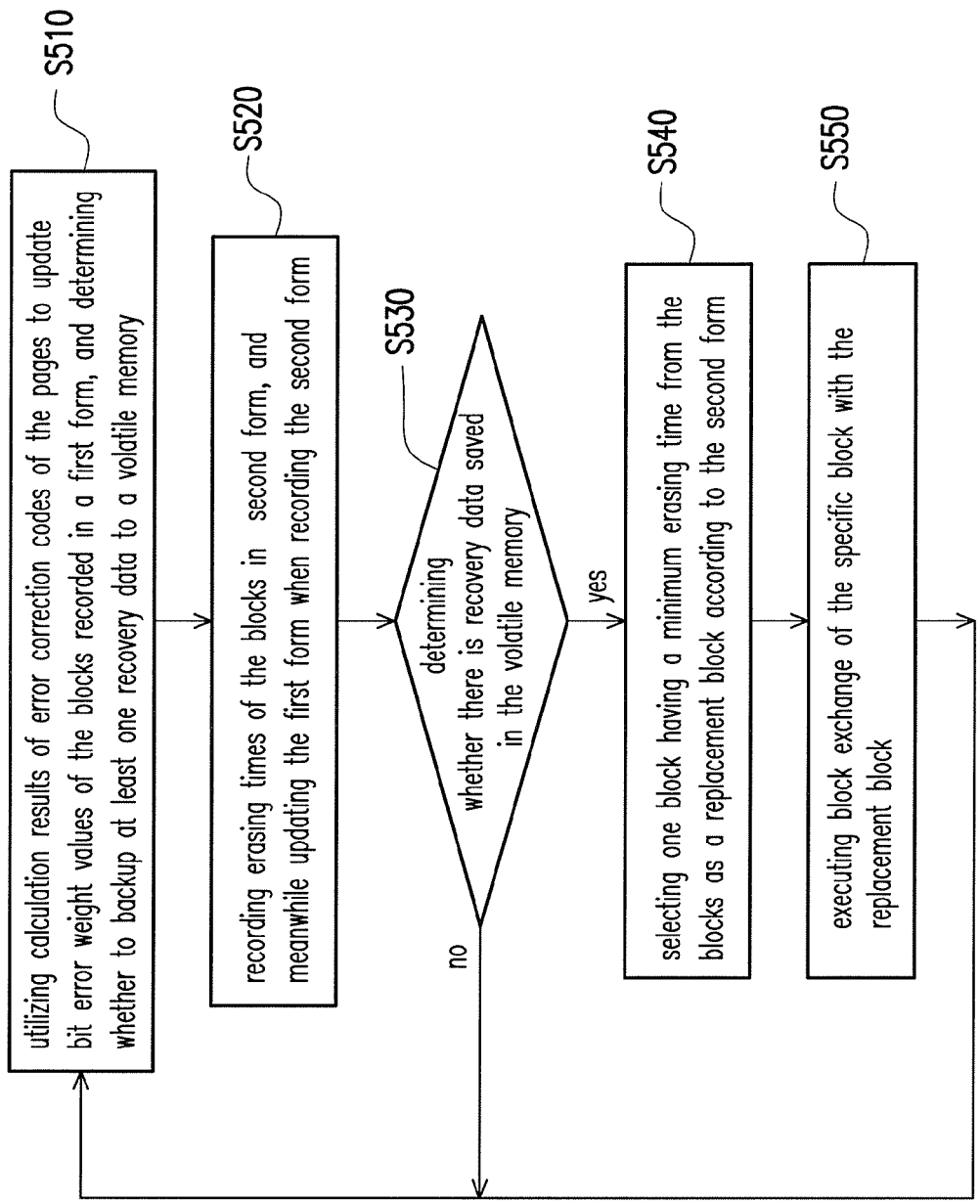
FIG. 5 is a flow chart illustrating a data protection method according to another embodiment of the present invention.

FIG. 5 is a flow chart illustrating a data protection method according to another embodiment of the present invention. The data protection method is adapted for a plurality of pages of a plurality of blocks of a non-volatile memory. Referring to FIG. 5, first at step S510, calculation results of error correction codes of several pages of the non-volatile memory are used for updating bit error weight values of the blocks recorded in a first form, so as to determine whether to backup at least one recovery data to a volatile memory.

Then, at step S520, erasing times of the blocks are recorded in a second form, and meanwhile the first form is updated. Then, at step S530, it is determined whether there is recovery data saved in the volatile memory. If there is a recovery data saved in the volatile memory, then the flow executes step S540, in which a block having a minimum erasing time is selected out from the blocks according to the second form as a replacement block. Then, at step S550, a block exchange operation is executed with respect to a specific block and the replacement block.

Otherwise, if there is no recovery data saved in the volatile memory, the flow returns to the step S510, thus maintaining regular operation of the system. However, it should be noted that by executing the steps S520 and S540, those blocks having less erasing times would be released for being used as blocks for block exchange. In such a way, comparing with the conventional technologies, the present invention utilizes all blocks of the non-volatile memory in an average manner. Further, those skilled in the art may vary the flow of the steps given above by the embodiment of FIG. 5 as desired in accordance with the spirit of the present invention.

Figure 6:
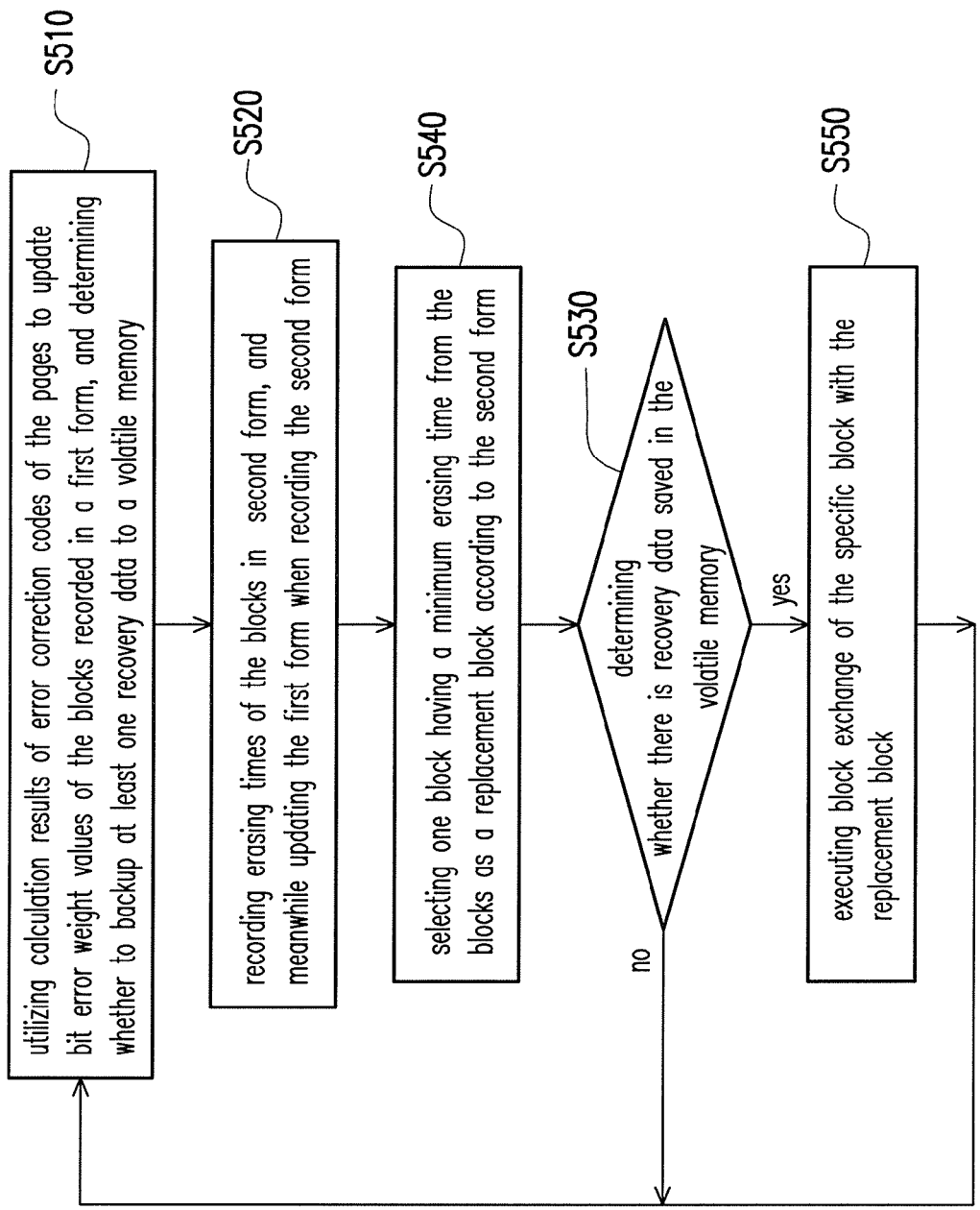
FIG. 6 is a flow chart illustrating a data protection method obtained by modifying the embodiment of FIG. 5 according to another embodiment of the present invention.

For example, FIG. 6 is a flow chart illustrating a data protection method obtained by modifying the embodiment of FIG. 5 according to another embodiment of the present invention. Referring to FIG. 6, the embodiment of FIG. 6 differs from the embodiment of FIG. 5 in that it finds out the replacement block (at step S540) and thereafter determines whether there is any recovery data saved in the volatile memory (at step S530). As such, when it is determined that there is a recovery data saved in the volatile memory, the flow of FIG. 6 can directly execute the block exchange (step S550). Other details of the embodiment of FIG. 6 are similar to that of FIG. 5, and are not to be iterated hereby.

Figure 7:
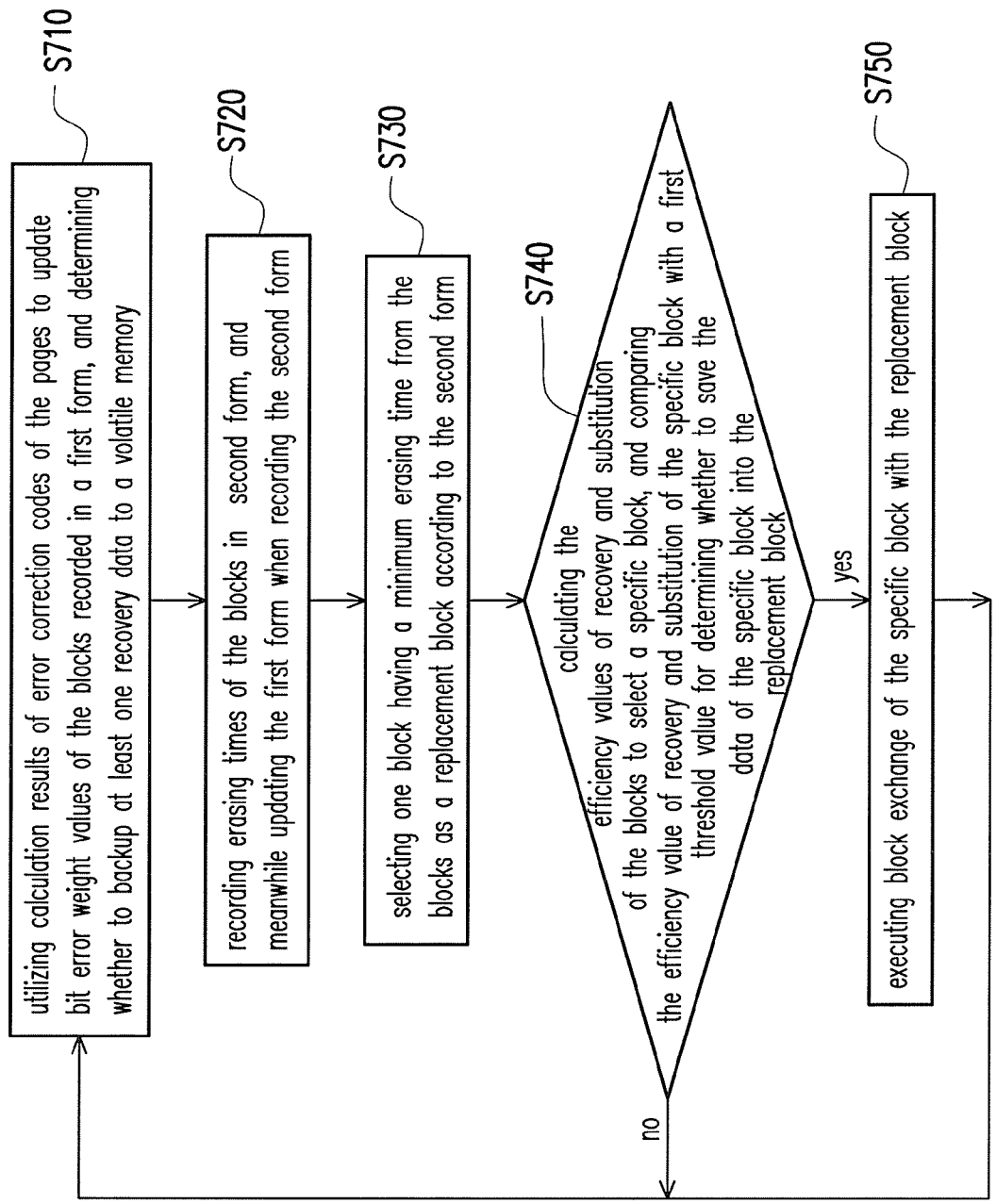
FIG. 7 is a flow chart illustrating a data protection method according to a further embodiment of the present invention.

FIG. 7 is a flow chart illustrating a data protection method according to a further embodiment of the present invention. The data protection method of FIG. 7 is adapted for a plurality of pages of a plurality of blocks of a non-volatile memory. Referring to FIG. 7, first, at step S710, calculation results of error correction codes of the pages are used for updating bit error weight values of the blocks recorded in a first form, so as to determine whether to backup at least one recovery data to a volatile memory. Then, at step S720, erasing times of the blocks are recorded in a second form, and meanwhile the first form is updated.

Then, at step S730, a block having a minimum erasing time is selected out from the blocks according to the second form and is taken as a replacement block. At step S740, efficiency values of recovery and substitution of the blocks are then calculated so as to select a specific block, and compare the efficiency value of recovery and substitution of the specific block with a first threshold value for determining whether to save the data of the specific block into the replacement block.

It should be further noted that when it is determined to save the data of the specific block into the replacement block, the flow executes step S750 to execute a block exchange with respect to the specific block and the replacement block. On the contrary, when it is determined not to save the data of the specific block into the replacement block, the flow returns back to step S710, thus maintaining regular operation of the system.

In summary, the present invention determines the priority sequence of recovering data of the blocks when the system is in an idle status according to the bit error weight values of the blocks. Further, with respect to those blocks having less erasing times, the present invention moves the data thereof to other blocks, so as to release the blocks from the data area for use. In such a way, comparing with the conventional technologies, the present invention utilizes all blocks of the non-volatile memory in an average manner more, so as to further extend the lifetime of the non-volatile memory. Further, the present invention employs a more effective mechanism to provide optimal protection to the data saved in the volatile memory and averagely execute the erasing operations.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A data protection method, adapted for a plurality of pages of a plurality of blocks in a non-volatile memory, the data protection method comprising:
   utilizing calculation results of error correction codes of the pages to update bit error weight values of the blocks recorded in a first form, and determining whether to backup at least one recovery data to a volatile memory;
   recording erasing times of the blocks in a second form, and meanwhile updating the first form;
   selecting one block having a minimum erasing time from the blocks as a replacement block according to the second form; and
   determining to execute a block exchange of a specific block with the replacement block in accordance with whether there is the recovery data saved.

2. The data protection method according to claim 1 further comprising:
   determining whether a system with the non-volatile memory is in an idle status;
   repeating all of the above steps, when the system with the non-volatile memory is in the idle status; and
   suspending all of the steps, when the system with the non-volatile memory is not in the idle status.

3. The data protection method according to claim 1, wherein the step of utilizing calculation results of error correction codes of the pages to update bit error weight values of the blocks recorded in the first form, and determining whether to backup at least one recovery data to the volatile memory further comprises:
   initializing the first form, when a system with the non-volatile memory is first time started;
   selecting one page from the pages as a predetermined page for reading;
   executing a calculation of the error correction codes to the predetermined page to obtain an error bit number of the predetermined page;
   obtaining a bit error weight value according to the error bit number;
   adding the bit error weight value to the bit error weight value of the block corresponding to the predetermined page, so as to update the first form;
   determining whether the bit error weight value exceeds a second threshold value;
   recovering and backing up the data of the predetermined page to obtain the recovery data, when the bit error weight value exceeds the second threshold value; and
   saving the first form into the non-volatile memory and repeating all of the above steps until all of the pages are read one by one, when the bit error weight value does not exceed the second threshold value.

4. The data protection method according to claim 1, wherein the step of recording erasing times of the blocks in the second form, and meanwhile updating the first form further comprises:
   initializing the second form, when the system with the non-volatile memory is first time started; and
   when one of the blocks is erased, adding 1 to the erasing time corresponding to the erased block recorded in the second form, and setting the error bit degree value corresponding to the erased block recorded in the first form as 0.

5. The data protection method according to claim 1, further comprising:
   determining whether the recovery data saved in the volatile memory or not;
   selecting the specific block, to which the recovery data belongs, from the blocks, and sequentially saving a part of data of the specific block and the recovery data in the replacement block, when the recovery data is saved in the volatile memory; and
   calculating the efficiency values of recovery and substitution of the blocks to select out the specific block, and determining whether to save the data of the specific block into the replacement block according to a first threshold value, when the recovery data is not saved in the volatile memory.

6. The data protection method according to claim 5, wherein the step of selecting the specific block, to which the recovery data belongs, from the blocks, and sequentially saving a part of data of the specific block and the recovery data in the replacement block further comprises:
   selecting out the page and the block to which the recovery data belongs from the pages and the blocks, as a specific page and a specific block; and
   reading out and recovering data of pages in the specific block other than the specific page, and sequentially saving the read out data of the specific block and the recovery data into the replacement block.

7. The data protection method according to claim 5, wherein the step of calculating the efficiency values of recovery and substitution of the blocks to select out the specific block, and determining whether to save the data of the specific block into the replacement block according to the first threshold value comprises:
   calculating the bit error weight values recorded in the first form and the erasing times recorded in the second form with a specific equation, to obtain the efficiency values of recovery and substitution of the blocks;
   selecting one block having a maximum efficiency value of recovery and substitution from the blocks as the specific block;
   determining whether the efficiency value of recovery and substitution of the specific block is greater than the first threshold value;

reading out and recovering the data of the specific block, and sequentially saving the recovered data of the specific block into the replacement block, when the efficiency value of recovery and substitution of the specific block is greater than the first threshold value; and remaining the data of the specific block unchanged, when the efficiency value of recovery and substitution of the specific block is not greater than the first threshold value.

8. The data protection method according to claim 7, wherein when the efficiency value of recovery and substitution of the $i^{th}$ block is represented as $BE_{bi}$, the bit error weight value of the $i^{th}$ block is represented as $ED_{bi}$, the erasing times of the $i^{th}$ block is represented as $EC_{bi}$, and the minimum erasing time recorded in the second form is represented as MinEC, wherein i is a positive integer, α and β are factors, the specific equation is defined as:

$$BE_{bi} = \alpha ED_{bi} + \beta(MinEC - EC_{bi})$$

when $(MinEC - EC_{bi}) < 0, \beta = 0$.

9. The data protection method according to claim 1, wherein the block exchange of executed to the specific block with the replacement block comprises:

linking a logic address linked to the specific block to the replacement block; and clearing the data of the specific block, and moving the specific block to a spare area.

10. The data protection method according to claim 1, further comprising:

determining whether the recovery data is saved in the volatile memory; and executing the block exchange of the specific block with the replacement block, when the recovery data is saved in the volatile memory.

11. The data protection method according to claim 1, further comprising:

calculating the efficiency values of recovery and substitution of the blocks, to select out the specific block; and comparing the efficiency value of recovery and substitution of the specific block with a first threshold value, for determining whether to save the data of the specific block to the replacement block, and executing the block exchange of the specific block with the replacement block when saving the data of the specific block to the replacement block.

12. The data protection method according to claim 1, further comprising:

determining whether to execute the block exchange of the specific block with the replacement block according to the efficiency value of recovery and substitution of the specific block.

13. A data protection method, adapted for a plurality of pages of a plurality of blocks in a non-volatile memory, the data protection method comprising:

executing a calculation of error correction codes to a predetermined page selected from the pages of the blocks to obtain an error bit number of the predetermined page;

obtaining a bit error weight value of the predetermined page according to the error bit number; and adding the bit error weight value of the predetermined page to a bit error weight value of the block corresponding to the predetermined page to obtain an accumulated bit error weight value of the block.

14. The data protection method according to claim 13, further comprising:

updating the bit error weight value of the block by the accumulated bit error weight value of the block in a first form.

15. The data protection method according to claim 14, further comprising:

recording erasing times of the block in a second form; and calculating an efficiency value of recovery and substitution of the block according to the bit error weight value of the block recorded in the first form and erasing times of the block recorded in the second form.

16. The data protection method according to claim 15, further comprising:

comparing the efficiency value of recovery and substitution of the block to a first threshold value to determine whether to execute a data recovery or data moving operation from the block to a replacement block.

17. The data protection method according to claim 15, wherein the efficiency value of recovery and substitution of the block can be derived from following equation:

$$BE_{bi} = \alpha ED_{bi} + \beta(MinEC - EC_{bi})$$

when $(MinEC - EC_{bi}) < 0, \beta = 0$.

wherein the efficiency value of recovery and substitution of the $i^{th}$ block is represented as $BE_{bi}$, the bit error weight value of the $i^{th}$ block is represented as $ED_{bi}$, the erasing times of the $i^{th}$ block is represented as $EC_{b}$, and minimum erasing times of the blocks recorded in the second form is represented as MinEC, wherein i is a positive integer, α and β are factors.

18. The data protection method according to claim 13, further comprising:

comparing the bit error weight value of the predetermined page to a second threshold value to determine whether to backup data of the predetermined page.

* * * * *